United States Patent [19]

Zaiki

[11] Patent Number: 4,975,872
[45] Date of Patent: Dec. 4, 1990

[54] DUAL PORT MEMORY DEVICE WITH TAG BIT MARKING

[75] Inventor: Koji Zaiki, Neyagawa, Japan

[73] Assignee: Matsushita Electric Industrial Co., Ltd., Osaka, Japan

[21] Appl. No.: 435,049

[22] Filed: Nov. 13, 1989

[30] Foreign Application Priority Data

Nov. 17, 1988 [JP] Japan ............................. 63-291176

[51] Int. Cl.$^5$ .............................................. G11C 7/00
[52] U.S. Cl. ................................. 365/49; 365/230.05; 365/189.07; 364/200
[58] Field of Search ................ 365/230.05, 49, 230.06, 365/189.07, 189.05, 233; 364/200 MS File, 900 MS File

[56] References Cited

U.S. PATENT DOCUMENTS

| 4,833,651 | 5/1989 | Seltzer et al. | 365/230.05 X |
| 4,860,263 | 8/1989 | Mattausch | 365/230.05 |
| 4,891,788 | 1/1990 | Kreifels | 365/230.05 X |

OTHER PUBLICATIONS

Knuth, D. E.: "The Art of Computer Programming", vol. 1, Fundamental Algorithms, Addison-Wesley, 1973 (pp. 406-420).

Primary Examiner—Stuart N. Hecker
Assistant Examiner—Alyssa H. Bowler
Attorney, Agent, or Firm—Stevens, Davis, Miller & Mosher

[57] ABSTRACT

A memory device comprises an address input, first decoder for decoding an address input applied to the address input means, two-port data storage for storing data, a tag field provided for each of word areas of the data storage means, means for reading data through the first port of the data storage means, data input/output means for writing in and reading out data through the second port of the data storage means, selecting means for selecting data read out through the first port of the data storage means or data externally inputted through the data input/output means, second decoding means for decoding an output data from the selecting means into an address, and control means for controlling reading out of data through the first port of the data storage means, controlling writing in and reading out of data through the second port of the data storage means, and operating in synchronism with an externally supplied clock signal for controlling marking in the tag fields selected sequentially according to address data inputted from the outside through the data input/output means.

5 Claims, 4 Drawing Sheets

DUAL PORT MEMORY DEVICE WITH TAG BIT MARKING

BACKGROUND OF THE INVENTION

This invention relates to a memory device, and more particularly to a memory device having a built-in circuit which permits access to data stored in the memory device and at the same time performs marking for the purpose of effecting garbage collection.

Computers are now being widely utilized more and more not only in the field of numerical calculations but also in various application fields such as artificial intelligence and natural lagnuage processing. With the ever-increasing utilization of the computers in these application fields, there arises the necessity of a data structure which makes the structure of storage areas be changed dynamically at the time of executing a program for use in the associated processings. For that purpose, dynamic management of storage areas is required. In the case of such dynamic storage area management, a method called garbage collection is used in which storage areas, which have become unnecessary, are collected for the purpose of reuse thereof. According to one form of the garbage collection method for collecting storage areas which have become unnecessary, storage areas in use are marked, so that storage areas which have not been marked, that is, unnecessary storage areas are collected. The aforesaid garbage collection method is described in Knuth, D. E.: The Art of Computer Programming, Vol. 1, Fundamental Algorithms, Addision-Wesley, 1973.

The semiconductor technology has made a great progress, and, because of this great progress of the semiconductor technology, the storage capacity of memory devices has been greatly increased. Thus, the prior art method described above is defective in that a long period of time is required for effecting the garbage collection.

SUMMARY OF THE INVENTION

It is an object of the present invention to provide a memory device having a marking circuit carrying out marking necessary for effecting the garbage collection incorporated therein to carry out marking at the same time with making access to data stored in the memory device, whereby the processing of the garbage collection can be executed at a high speed.

In accordance with the present invention for attaining the above object, there is provided a memory device comprising: address input means; first decoding means for decoding an address input applied to the address input means; two-port data storage means for storing data; a tag field provided for each of word areas of the data storage means; means for reading data through the first port of the data storage means; data input/output means for writing in and reading out data through the second port of the data storage means; selecting means for selecting data read out through the first port of the data storage means or data externally inputted through the data input/output means; second decoding means for decoding an output data from the selecting means into an address; and control means for controlling reading out of data through the first port of the data storage means, controlling writing in and reading out of data through the second port of the data storage means, and operating in synchronism with an externally supplied clock signal for controlling marking in the tag fields selected sequentially according to address data inputted from the outside through the data input/output means.

In the memory device of the present invention having the structure described above, a specific value supplied to the data input/output means is used as an address for reading data, that is, selecting a word and, at the same time, setting a symbol or flag (marking) in the tag field of the selected word, and the data of the selected word is used as an address for selecting the next word. In the manner described above, the operation for setting the symbol or flag (marking) in the tag field of a selected word is repeated until the tag fields of all the words that should be marked are marked. This marking operation can be done in synchronism with an externally applied clock signal without any necessity for reading out data to the outside of the memory device. Therefore, the marking for effecting garbage collection can be made at a high speed to ensure high-speed processing of garbage collection. Also, because the data storage means has the two ports, storing data and reading data in and out of the data storage means, respectively, can be carried out in parallel with the marking operation.

DESCRIPTION OF THE PREFERRED EMBODIMENT

Figure 1:
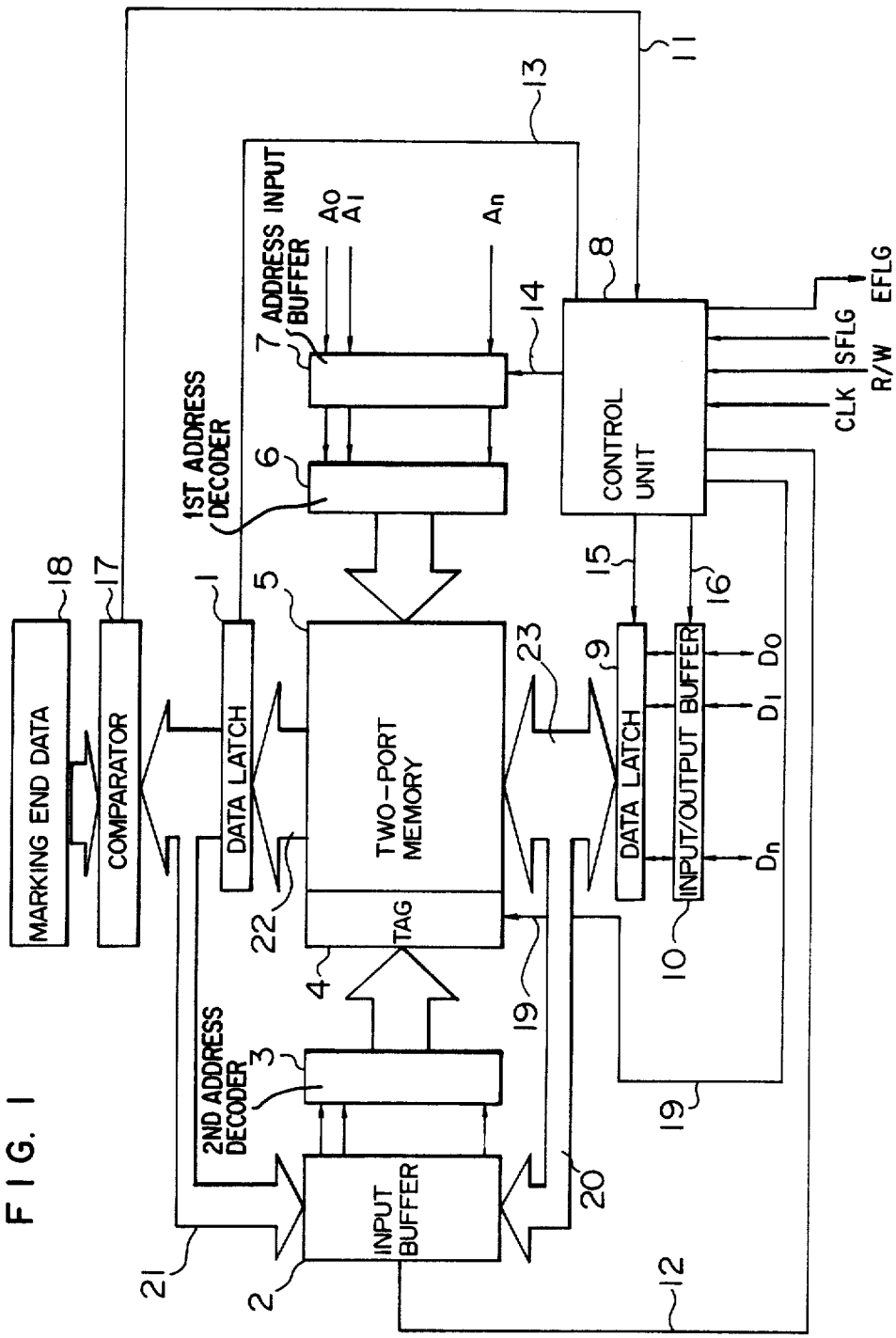
FIG. 1 is a block diagram showing the structure of the memory device of an embodiment of the present invention.

FIG. 1 is a block diagram showing the memory device of an embodiment of the present invention having a marking circuit incorporated therein for effecting garbage collection. Referring to FIG. 1, principal parts of the memory device include an address input buffer 7 acting as an address input means, a first address decoder 6 for decoding an address inputted to the address input buffer 7, a two-port memory 5 having two ports 22 and 23 allowing writing-in and reading-out of data to be performed simultaneously and having a tag field 4 provided for each word to indicate whether the associated word storage area is in use or not, a data latch 1 provided for reading out data through the first port 22 of the two-port memory 5, data input/output means composed of a data latch 9 and an input/output buffer 10 for effecting writing-in and reading-out of data through the second port 23 of the two-port memory 5, an input buffer 2 acting as a selecting means for making selection between data read out through the first port 22 of the two-port memory 5 and data inputted from the outside to the data input/output means, a second address decoder 3 for decoding an outer data from the input buffer 2 into an address, and a control unit 8 for controlling reading-out of data through the first port 22 of the two-port memory 5, controlling writing-in and reading-out of data through the second port 23 of the two-port memory 5, and operating in synchronism with an externally supplied clock signal to control marking in the tag fields 4 selected sequentially according to addresses inputted from the outside through the data input/output means.

In usual processing of performing writing-in and reading-out of data, addresses Ao to An are inputted from the outside through the address input buffer 7 under the control of an address input control signal 14 generated from the control unit 8. Then, the address decoder 6 decodes the addresses Ao to An to specify one of the word areas stored in the two-port memory 5. When the data in the specified word area is to be read out, a write/read control signal R/W for instructing reading-out of data is applied to the control unit 8. Then, the data in the specified word area is read out through the second port 23 of the two-port memory 5 and latched in the data latch 9 under the control of a first data input/output latch signal 15 generated from the control unit 8, and the data Do to Dn is outputted through the input/output buffer 10 to the outside under the control of a data input/output control signal 16 generated from the control unit 8. On the other hand, when the data Do to Dn from the outside is to be written in the specified word area of the two-port memory 5, the write/read control signal R/W instructing writing-in of data is applied to the control unit 8. The data Do to Dn is inputted through the input/output buffer 10 under the control of the data input/output control signal 16 generated from the control unit 8 and is then latched in the data latch 9 under the control of the first data input/output latch signal 15 generated from the control unit 8. Then, the input data is written in the specified word area of the two-port memory 5 through the second port 23.

Now, when marking for effecting garbage collection is carried out, data Do to Dn indicative of the address of first list element is inputted through the input/output buffer 10, and the control unit 8 generates a first data input/output latch signal 15 when a marking starting SFLG is applied from the outside to the control unit 8. Under the control of the first data input/output latch signal 15, the data Do to Dn indicative of the address of the first list element is latched in the data latch 9, and then the address data Do to Dn is transferred to the input buffer 2 by way of a first bus 20. Then, under the control of a select signal 12 generated from the control unit 8, the address data Do to Dn is transferred from the input buffer 2 to the address decoder 3 which specifies one of the word areas in the two-port memory 5. Then, in synchronism with an externally applied clock signal CLK, "1" is set in the tag field 4 of the specified word area by the application of a marking signal 19 generated from the control unit 8. The specified word data is transferred through the first port 22 and is latched in the data latch 1 under the control of a second data input/output latch signal 13 generated from the control unit 8. Then, the data latched in the data latch 1 is compared in a comparator 17 with a pre-set marking end data (NIL) 18, and, when coincidence is detected in the comparison between both data, a coincidence detection signal 11 is supplied from the comparator 17 to the control unit 8. In response to the application of the coincidence detection signal 11, a marking end signal EFLG indicative of completion of the marking operation is outputted to the outside from the control unit 8, thereby completing the marking operation. On the other hand, when no coincidence is detected between both data in the comparison made by the comparator 17, the data latched in the data latch 1 is transferred to the input buffer 2 in synchronism with the clock signal CLK, and is then transferred from the input buffer 2 to the address decoder 3 under the control of the select signal 12. The data is decoded in the address decoder 3 to specify one of the word areas in the two-port memory 5, and "1" is set in the tag field 4 of the word area by the application of the marking signal 19.

Figure 2:
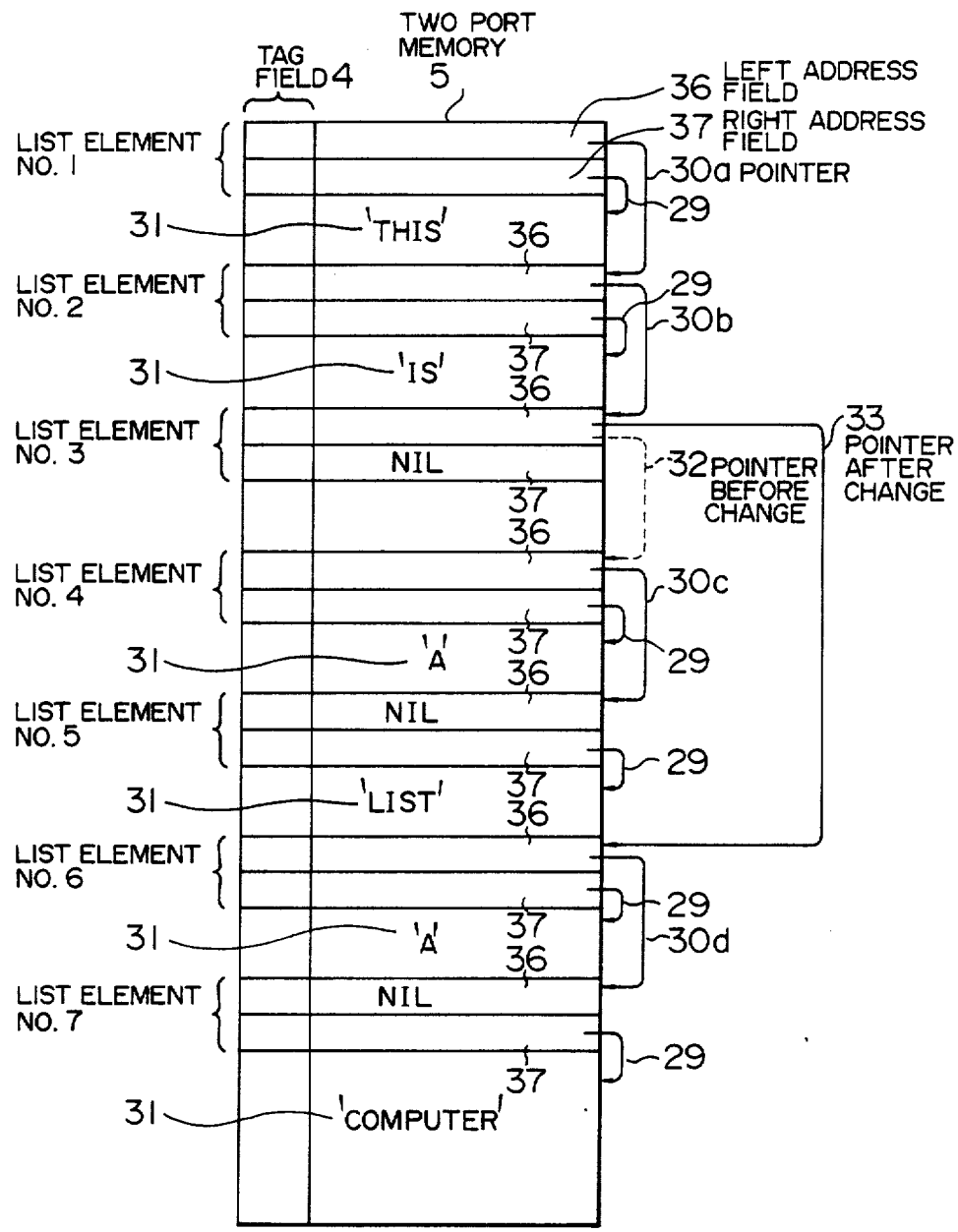
FIG. 2 shows the internal state of the two-port memory in the memory device shown in FIG. 1 before marking is made in the stored list data.

FIG. 2 shows the arrangement of list data stored in the two-port memory 5 shown in FIG. 1. Referring to FIG. 2, each of plural list elements Nos. 1 to 7 is composed of the tag field 4 indicating whether the list element is in use or not, a left address field 36 storing the address of another list element, and a right address field 37 storing an address where a character string data 31 is stored. The left and right address fields 36 and 37 of the list elements Nos. 1 to 7 are assigned respectively to successive addresses of consecutive words. The address of the list element No. 2 is stored in the left address field 36 of the list element No. 1, and a pointer 30a indicates this state. Similarly, the list element No. 2 is linked to the list element No. 3 by a pointer 30b. The list element No. 3 is linked to the list element No. 4 by a pointer 32 before it is changed as described later, and the list element No. 4 is linked to the list element No. 5 by a pointer 30c. The marking end data NIL is stored in the left address field 36 of the list element No. 5, which indicates that the list element No. 5 is not linked to the next list element No. 6.

Further, the right address field 37 of each of the list elements Nos. 1 to 7 is linked to an associated character string data 31 by a pointer 29.

Suppose now that the list structure shown in FIG. 2 is changed in the course of execution of a program, and the content of the left address field 36 of the list element No. 3 is changed. In this case, the pointer 32 is changed to a pointer 33. In this case, the list element No. 3 is now linked to the list element No. 6 by the pointer 33 whch has replaced the pointer 32. Also, the list element No. 6 is linked to the list element No. 7 by a pointer 30d. Thus, when the left address fields 36 of the list elements Nos. 1 to 7 are traced sequentially from the list element No. 1, the list elements now in use can be traced in the order of the list element No. 1, list element No. 2, list element No. 3, list element No. 6 and list element No. 7. Because the marking end data NIL is stored in the left address field 36 of the last list element No. 7, no further list element can be traced. Thus, the list elements Nos. 4 and 5 are unnecessary ones.

Figure 3:
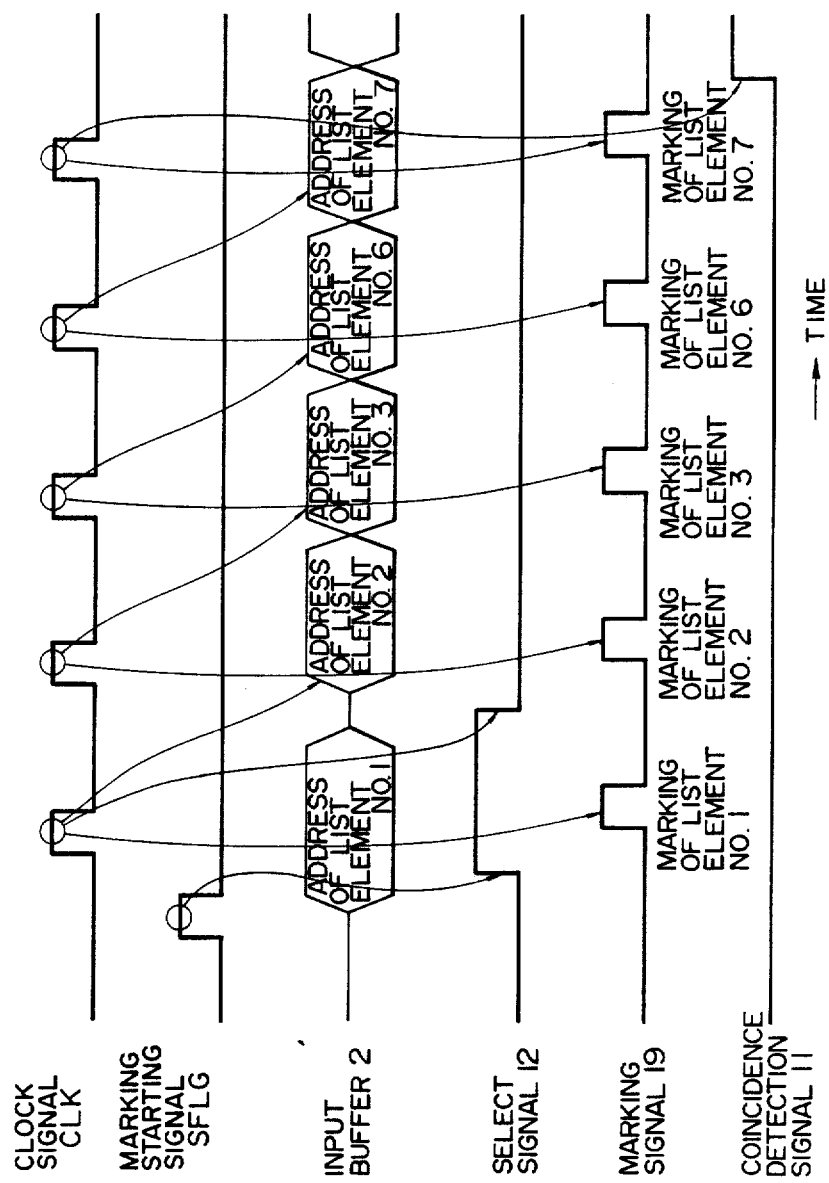
FIG. 3 is a timing chart showing the process of marking.
Figure 4:
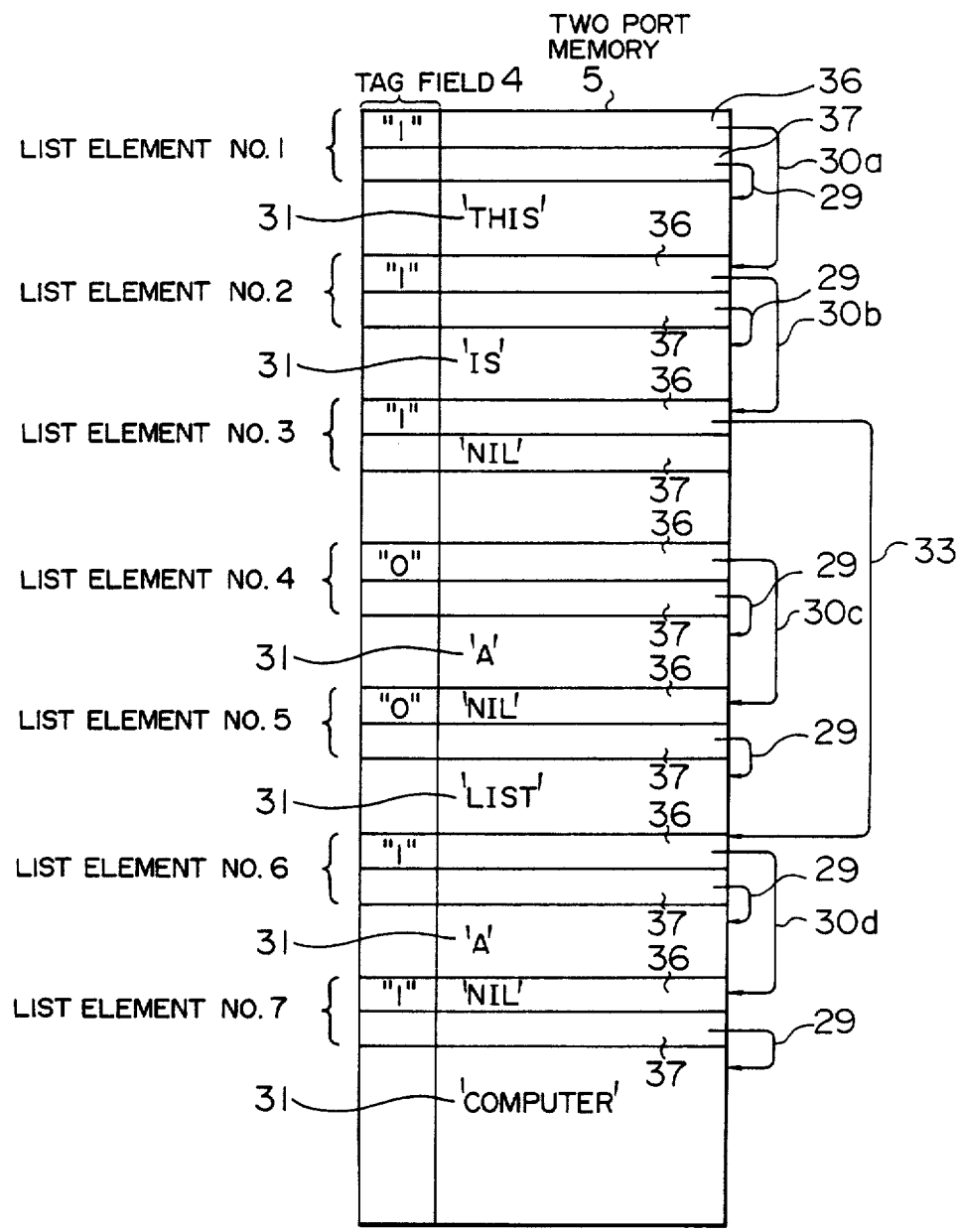
FIG. 4 shows the internal state of the two-port memory after the completion of marking.

Next, an explanation is made of processing steps in which the memory device incorporating the marking circuit for effecting garbage-collection, as shown in FIG. 1, is used to collect the unnecessary list elements Nos. 4 and 5 through a pointer changing procedure as shown in FIG. 2. The sequence of processing of marking for effecting collection of the unnecessary list elements Nos. 4 and 5 will now be described in conjunction with FIG. 3 which is a timing chart for the process of marking. At the beginning of the marking operation, the address data Do to Dn for the first list element No. 1 t be marked in the first place is inputted through the input/output buffer 10, and the marking starting signal SFLG is applied to the control unit 8. Under the control of the first data input/output latch signal 15 generated from the control unit 8 in response to the application of the marking starting signal SFLG, the address data Do to Dn for the list element No. 1 is latched in the data latch 9. As shown in FIG. 3, since the select signal 12 generated from the control unit 8 is at high level at this time, the address data Do to Dn is transferred by way of the first bus 20 from the data latch 9 through the input buffer 2 to the address decoder 3, where the left address field 36 of the list element No. 1 in the two-port memory 5 is specified. Here, in synchronism with the externally applied clock signal CLK, "1" is set in the tag field 4 for the left address field 36 of the list element No. 1 by the application of the marking signal 19 generated from the control unit 8, and the value stored in the left address field 36 of the list element No. 1 is latched in the data latch 1 through the first port 22 of the two-port memory 5 under the control of the second data input/output latch signal 13 generated from the control unit 8. The value latched now in the data latch 1 indicates the address of the left address field 36 of the list element No. 2. When this value is compared in the comparator 17 with the marking end data (NIL) 18, the former does not coincide with the latter. Further, since the select signal 12 is at low level at this time, as shown in FIG. 3, data supplied by way of a second bus 21, that is, the address data of the next list element No. 2 is selected. The selected address data is transferred through the input buffer 2 to the address decoder 3 and is decoded by the address decoder 3 to specify the left address field 36 of the list element No. 2. Here, in synchronism with the externally applied clock signal CLK, "1" is set in the tag field 4 for the left address field 36 of the list element No. 2 by the application of the marking signal 19 generated from the control unit 8, and the value stored in the left address field 36 of the list element No. 2 is latched in the data latch 1 under the control of the second data input/output latch signal 13 generated from the control unit 8. The value latched now in the data latch 1 indicates the address of the left address field 36 of the list element No. 3. When this value is compared in the comparator 17 with the marking end data (NIL) 18, the former does not coincide with the latter. Then, similar processing is further executed until finally the value stored in the left address field 36 of the list element No. 7 is latched in the data latch 1. When this value is compared in the comparator 17 with the marking end data (NIL) 18, the former coincides with the latter. Then, a coincidence detection signal 11 is supplied from the comparator 17 to the control unit 8, and the marking end signal EFLG indicating the completion of the marking operation is outputted to the outside from the control unit 8. FIG. 4 shows the internal state of the two-port memory 5 after the marking operation has been completed.

After the marking operation described above has been completed, the tag fields 4 of all the list elements are checked, and unnecessary storage areas, that is, the list elements Nos. 4 and 5, in each of which "1" is not set in the tag field 4, are collected. When the collecting process has been entirely completed, "0" is set in the tag field 4 of each of the word areas.

Since the present invention employs the two-port memory 5 for storing data, entirely independently of the series of marking operation steps described above, addresses Ao to An can be inputted through the address input buffer 7 and the address decoder 6 to the two-port memory 5, and data can be written and read in and out of the two-port memory 5, respectively, through the second port 23 and the data input/output means.

It will be understood from the foregoing description that the memory device embodying the present invention comprises the two-port memory 5 as a data storage means, and this two-port memory 5 includes the tag fields 4 which indicate whether the storage areas are in use or not. Thus, in the present invention, by the external application of the clock signal CLK to the control unit 8 in the memory device, it is possible to sequentially read out data from the two-port memory 5 and to effect marking in synchronism with the clock signal CLK. Therefore, as compared with the prior art memory device in which data is sequentially read out to the outside of the memory device and marking is made on the basis of the externally read-out data, the present invention is advantageous in that marking can be made at a higher speed, thereby increasing the speed of garbage collection. The present invention is further advantageous in that marking for effecting garbage collection can be carried out in parallel with the usual processing of writing and reading of data in and out of the memory device, respectively, and execution of the usual processing need not be interrupted in order to effect garbage collection.

I claim:

1. A memory device comprising:
   address input means;
   first decoding means for decoding an address input applied to said address input means;
   two-port data storage mean for storing data;
   a tag field provided for each of word areas of said data storage means;
   means for reading data through the first port of said data storage means;
   data input/output means for writing in and reading out data through the second port of said data storage means;
   selecting means for selecting data read out through the first port of said data storage means or data externally inputted through said data input/output means;
   second decoding means for decoding an output data from said selecting means into an address; and
   control means for controlling reading out of data through the first port of said data storage means, controlling writing in and reading out of data through the second port of said data storage means, and operating in synchronism with an externally supplied clock signal for controlling marking in the tag fields selected sequentially according to address data inputted from the outside through said data input/output means.

2. A memory device according to claim 1, wherein the address data inputted from the outside through said data input/output means is an address of a first list element to be marked.

3. A memory device according to claim 1, wherein said selecting means first selects the address data inputted from the outside through said data input/output means and thereafter selects the data read out through the first port of said data storage means.

4. A memory device according to claim 1, wherein the marking operation is completed upon completion of a comparison made in comparing means between the data read out through the first port of said data storage means and marking end data.

5. A memory device according to claim 1, wherein marking in said tag field is carried out in parallel with the writing in and reading out of data through the second port of said data storage means.

* * * * *